(12) United States Patent
Ravikumar et al.

(10) Patent No.: US 9,698,286 B2
(45) Date of Patent: Jul. 4, 2017

(54) QUANTUM WELL INFRARED PHOTODETECTORS USING II-VI MATERIAL SYSTEMS

(71) Applicants: Arvind Ravikumar, Princeton, NJ (US); Claire Gmachl, Princeton, NJ (US); Aidong Shen, Rego Park, NY (US); Maria Tamargo, Teaneck, NJ (US)

(72) Inventors: Arvind Ravikumar, Princeton, NJ (US); Claire Gmachl, Princeton, NJ (US); Aidong Shen, Rego Park, NY (US); Maria Tamargo, Teaneck, NJ (US)

(73) Assignees: THE RESEARCH FOUNDATION OF THE CITY UNIVERSITY OF NEW YORK, New York, NY (US); THE TRUSTEES OF PRINCETON UNIVERSITY, Princeton, NJ (US)

( * ) Notice: Subject to any disclaimer, the term of this patent is extended or adjusted under 35 U.S.C. 154(b) by 46 days.

(21) Appl. No.: 14/185,404

(22) Filed: Feb. 20, 2014

(65) Prior Publication Data
US 2014/0231750 A1 Aug. 21, 2014

Related U.S. Application Data

(60) Provisional application No. 61/766,993, filed on Feb. 20, 2013.

(51) Int. Cl.
*H01L 31/0296* (2006.01)
*H01L 31/18* (2006.01)
(Continued)

(52) U.S. Cl.
CPC ........ *H01L 31/02966* (2013.01); *H01L 31/035236* (2013.01); *H01L 31/1013* (2013.01);
(Continued)

(58) Field of Classification Search
CPC ......... H01L 31/0296; H01L 31/035209; H01L 31/1832; H01L 31/1013; H01L 31/18; H01L 31/0352
(Continued)

(56) References Cited

U.S. PATENT DOCUMENTS

2005/0082520 A1* 4/2005 Fathimulla et al. ............ 257/14
2010/0301308 A1* 12/2010 Ahn ................................ 257/14

OTHER PUBLICATIONS

A.Shen, H. Lu, W.Charles, I. Yokomizo et al., "Intersubband absorption in CdSe/ZnxCdyMg1xySe self-assembled quantum dot multilayers", Applied Physics Letters,90, (2007).

(Continued)

*Primary Examiner* — Selim Ahmed
(74) *Attorney, Agent, or Firm* — Meagher Emanuel Laks Goldberg & Liao, LLP

(57) ABSTRACT

A quantum well infrared photodetector (QWIP) and method of making is disclosed. The QWIP includes a plurality of epi-layers formed into multiple periods of quantum wells, each of the quantum wells being separated by a barrier, the quantum wells and barriers being formed of II-VI semiconductor materials. A multiple wavelength QWIP is also disclosed and includes a plurality of QWIPs stacked onto a single epitaxial structure, in which the different QWIPs are designed to respond at different wavelengths. A dual wavelength QWIP is also disclosed and includes two QWIPs stacked onto a single epitaxial structure, in which one QWIP is designed to respond at 10 μm and the other at 3-5 μm wavelengths.

21 Claims, 11 Drawing Sheets

(51) Int. Cl.
*H01L 31/0352* (2006.01)
*H01L 31/101* (2006.01)

(52) U.S. Cl.
CPC ...... *H01L 31/1832* (2013.01); *H01L 31/1836* (2013.01); *Y02E 10/50* (2013.01)

(58) Field of Classification Search
USPC .............................................. 257/21; 438/94
See application file for complete search history.

(56) References Cited

OTHER PUBLICATIONS

Zhengmao Ye, Joe C. Campbell, Zhonghui Chen, Eui-Tae Kim, and Anupam Madhukar, "InAs quantum dot infrared photodetectors with In0.15Ga0.85As strain-relief cap layers", Journal of Applied Physics, 92, (2002).
B. S. Li, A. Shen, W. O. Charles, Q. Zhang, and M. C. Tamargo, "Midinfrared intersubband absorption in wide band gap II-VI ZnxCd1xSe multiple quantum wells with metastable zincblende MgSe barriers", Applied Physics Letters, 92, (2008).
Carlo Sirtori, Federico Capasso, and Jerome Faist, "Nonparabolicity and a sum rule associated with bound-to-bound and bound-to-continuum intersubband transitions in quantum wells", Physical Review B, 50,12, (Sep. 1994).
Daniel Wang, Gijs Bosman, and Sheng S. Li, "On the dark current noise of quantum well infrared photodetectors", Applied Physics Letters, 65, (1994).
Vincent Guériaux, Alexandru Nedelcu, and Philippe Bois, "Double barrier strained quantum well infrared photodetectors for the 3-5m atmospheric window", Journal of Applied Physics, 105, (2009).
E. C. Larkins, H. Schneider, S. Ehret, et al., "Influences of MBE Growth Processes on Photovoltaic 3-5 μm Intersubband Photodetectors", IEEE Transactions on Electron Devices, vol. 41, (Apr. 1994).
Eui-Tae Kim, Anupam Madhukar, Zhengmao Ye, and Joe C. Campbell, "High detectivity InAs quantum dot infrared photodetectors", Applied Physics Letters, 86, (2004).
Daniel Hofstetter, Sven-Silvius Schad, Hong Wu, William J. Schaff, and Lester F. Eastman,"GaN/AlN-based quantum-well infrared photodetector for 1.55 μm", Applied Physics Letters, 83, (2003).
H. Lu, a. A Shen, M. C. Tamargo, C. Y. Song, H. C. Liu et al., "Midinfrared intersubband absorption in ZnxCd1xSe/ZnxCdyMg1xySe multiple quantum well structures", 89, (2006).
H. Lu, A. Shen, and M. C. Tamargo et al., "Study of intersubband transitions of ZnxCd1-xSe/ZnxCdyMg1-x-ySe multiple quantum wells grown by molecular beam epitaxy for midinfrared device applications", J. Vac. Sci. Technol., 25, (May 2007).
H. C. Liu, Z. R. Wasilewski, M. Buchanan, and Hanyou Chu, "Segregation of Si doping in GaAsAlGaAs quantum wells and the cause of the asymmetry in the currentvoltage characteristics of intersubband infrared detectors", Applied Physics Letters, 63, (1993).
Nutan Gautam, S. Myers, A. V. Barve, Brianna Klein, E. P. Smith et al., "High operating temperature interband cascade midwave infrared detector based on type-II InAs/GaSb strained layer superlattice", 101, (2012).

O. O. Cellek: S. Ozer, and C. Besikci, "High Responsivity InP—InGaAs Quantum-Well Infrared Photodetectors: Characteristics and Focal Plane Array Performance", IEEE Journal of Quantum Electronics, 41, (Jul. 2005).
Ajit V. Barve, Thomas Rotter, Yagya Sharma, Sang Jun Lee, Sam Kyu Noh et al., "Systematic study of different transitions in high operating temperature quantum dots in a well photodetectors", Applied Physics Letters, 97, (2010).
F. R. Giorgetta, E. Baumann, D. Hofstetter, C. Manz, Q. Yang et al., "InGaAs/AlAsSb quantum cascade detectors in operating the near infrared", Applied Physics Letters, 91, (2007).
Kale J. Franz, William O. Charles, Aidong Shen, Anthony J. Hoffman, Maria C. Tamargo et al., "ZnCdSe/ZnCdMgSe quantum cascade electroluminescence", Applied Physics Letters, 92, (2008).
M. Ershov, H. C. Liu, M. Buchanan, Z. R. Wasilewski, and V. Ryzhii, "Photoconductivity nonlinearity at high excitation power quantum well infrared photodetectors", Applied Physics Letters, 70, (1997).
Wei Wu, Alireza Bonakdar, and Hooman Mohseni, "Plasmonic enhanced quantum well infrared photodetector with high detectivity", Applied Physics Letters, 96, (2010).
K. T. T Lai, S. K. Haywood, A. H. Mohamed, M. Missous, and R. Gupta, "Photovoltaic operation up to 270 K of a strain-compensated AlAs/In0.84Ga0.16As/AlAs/InAlAs quantum well infrared photodetector", 87, (2005).
Jamie Phillips, "Evaluation of the fundamental properties of quantum dot infrared detectors", Journal of Applied Physics, 91, (2002).
S. Tsao, H. Lim, W. Zhang, and M. Razeghi, "High operating temperature 320×256 middle-wavelength infrared focal plane array imaging based on an InAs/InGaAs/InAlAs/InP quantum dot infrared photodetector", 90, (2007).
Sanjay Krishna, Darren Forman, Senthil Annamalai et al., "Demonstration of a 320×256 two-color focal plane array using InAs/InGaAs quantum dots in well detectors", Applied Physics Letters, 86, (2005).
F. R. Giorgetta, E. Baumann, R. Théron, M. L. Pellaton, D. Hofstetter et al., "Short wavelength (4μm) quantum cascade detector based on strain compensated InGaAs/InAlAs", Applied Physics Letters, 92, (2008).
Mohammad Sohel, Xuecong Zhou, Hong Lu, M. Noemi Perez-Paz et al., "Optical characterization and evaluation of the conduction band offset for ZnCdSe/ZnMgSe quantum wells grown on InP(001) by molecular-beam epitaxy", J. Vac. Sci. Technol., 23, (Jun. 2005).
W. O. Charles, and A. Shen et al., "Growth and characterization of ZnxCd1-xSe/ZnxCdyMg1-x-ySe asymmetric coupled quantum well structures for quantum cascade laser applications", J. Vac. Sci. Technol., 26, (Jun. 2008).
Yu Yao, Adrian Alfaro-Martinez, Kale J. Franz, William O. Charles, Aidong Shen et al., "Room temperature and narrow intersubband electroluminescence from ZnCdSe/ZnCdMgSe quantum cascade laser structures", Applied Physics Letters, 99, (2011).
Oleg Zakharov, Angel Rubio, X. Blase, Marvin L. Cohen, and Steven G. Louie, "Quasiparticle band structures of six II-VI compounds: ZnS, ZnSe, ZnTe, CdS, CdSe, and CdTe", Physical Review, 50, (Oct. 1994).
Z. R. Wasilewski, H. C. Liu, and M. Buchanan, "Studies of Si segregation in GaAs using current-voltage characteristics of quantum well infrared photodetectors", Journal of Vacuum Science & Technology, 12, (1994).

\* cited by examiner

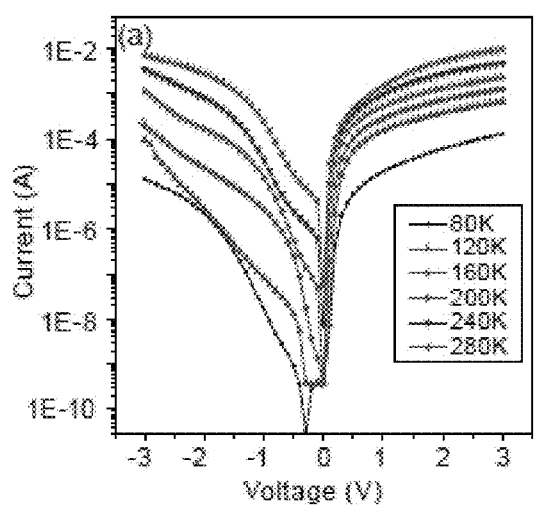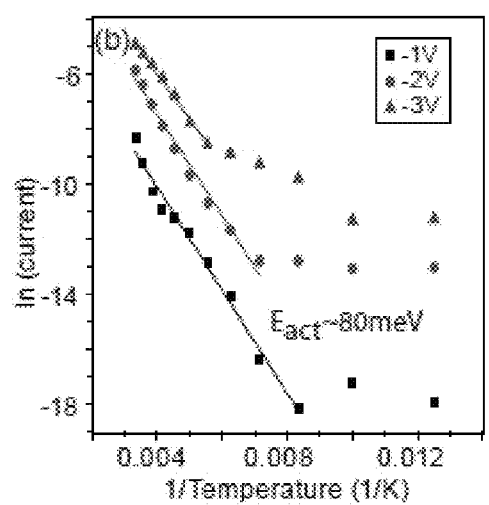
Figure 3a                    Figure 3b

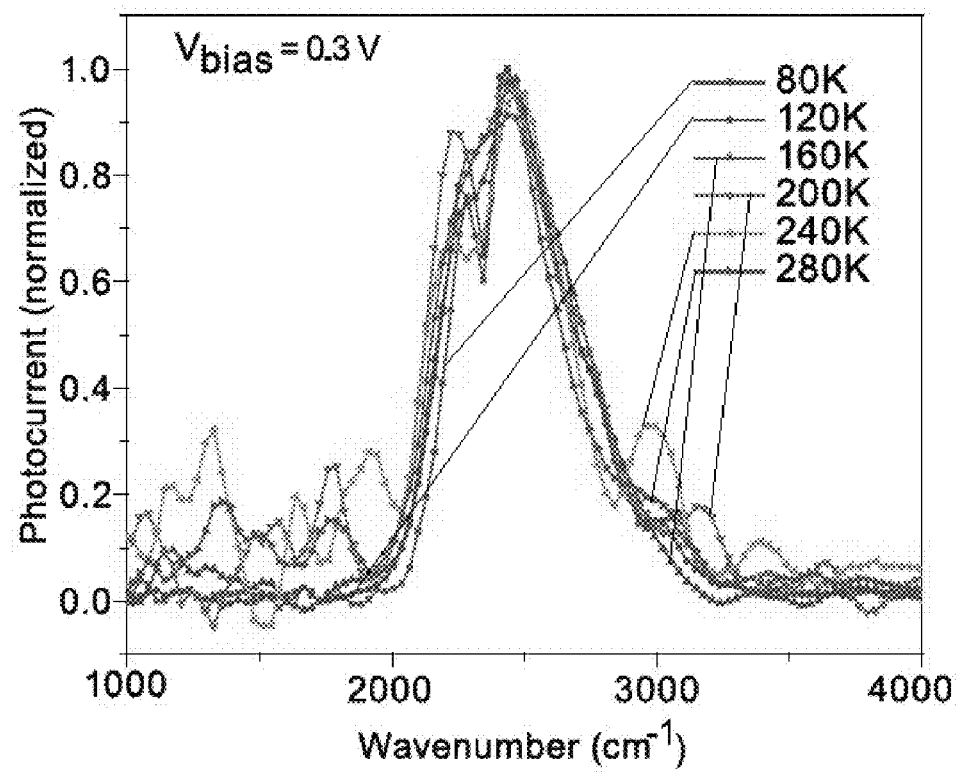
Figure 6a
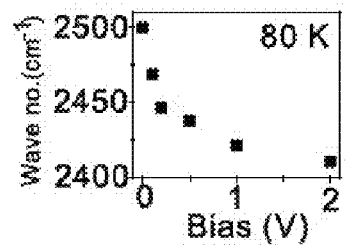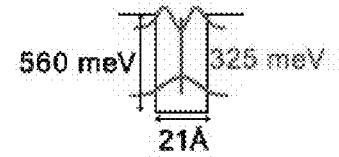
Figure 6b            Figure 6c

US 9,698,286 B2

QUANTUM WELL INFRARED PHOTODETECTORS USING II-VI MATERIAL SYSTEMS

CROSS-REFERENCE TO PRIOR FILED APPLICATIONS

This application claims priority to U.S. provisional applications 61/766,993 which was filed on Feb. 20, 2013 which is incorporated herein in its entirety.

GOVERNMENT RIGHTS IN THIS INVENTION

This invention was made with government support under Grant #EEC-0540832, #ECCS-1028364 and #HRD-0833180 awarded by the National Science Foundation. The government has certain rights in this invention.

TECHNICAL FIELD

This invention relates generally to quantum well infrared photodetectors and more specifically, to quantum well infrared photodetectors constructed from II-VI materials.

BACKGROUND

Quantum Well Infrared Photodetectors (QWIPs) have been extensively studied over the past decades chiefly for their application in thermal imaging as large area focal plane arrays. The faster response time and compatibility with standard fabrication methods makes these detectors a promising alternative to the widely used HgCdTe and InSb based detectors in the mid-infrared (mid-IR) regime. Improved devices are desirable.

SUMMARY OF THE INVENTION

A quantum well infrared photodetector (QWIP) is disclosed. The QWIP includes a plurality of epi-layers formed into multiple periods of quantum wells, each of the quantum wells being separated by a barrier, the quantum wells and barriers being formed of II-VI semiconductor materials. A multiple wavelength QWIP is also disclosed and includes a plurality of QWIPs stacked onto a single epitaxial structure, in which the different QWIPs are designed to respond at different wavelengths. A dual wavelength QWIP is also disclosed and includes two QWIPs stacked onto a single epitaxial structure, in which one QWIP is designed to respond at 10 µm and the other at 3-5 µm wavelengths.

A method of making quantum well infrared photodetector (QWIP) is also disclosed. The method includes forming a plurality of epi-layers formed into multiple periods of quantum wells and forming at least one barrier between the quantum wells, the quantum wells and barrier being formed of II-VI semiconductor materials. A plurality of QWIPs may be stacked onto a single epitaxial structure, in which the different QWIPs are designed to respond at different wavelengths. A dual wavelength QWIP may be formed of two QWIPs stacked onto a single epitaxial structure, in which one QWIP is designed to respond at 10 µm and the other at 3-5 µm wavelengths.

The II-VI semiconductor materials for the quantum well may include Zinc, cadmium and selenium. The II-VI semiconductor materials for the barrier may include Zinc, cadmium, selenium and Magnesium. The QWIP may include an active region grown on an InP substrate and the II-VI semiconductor materials comprise Zinc, Cadmium, Selenium and Magnesium with compositions that produce layers that are lattice-matched to the InP substrate. The quantum wells may include $Zn_{0.51}Cd_{0.49}Se$. The barriers may include $Zn_{0.45}Cd_{0.42}Mg_{0.13}Se$. The barriers may include $Zn_{0.29}Cd_{0.26}Mg_{0.45}Se$. The QWIP may include an active region grown on an InP substrate. The QWIP may include an active region grown on InP substrate with a lattice-matched InGaAs buffer layer.

BRIEF DESCRIPTION OF THE FIGURES

FIG. 3a is graph showing the dark current characteristics of the QWIP as a function of temperature from 80 K to 280 K;

FIG. 3b is graph showing a logarithmic plot of the dark current as a function of inverse temperature, at different applied bias;

FIG. 6a is a graph showing the normalized photoresponse of a short wavelength (3-5 µm) QWIP as a function of temperature at an applied bias of 0.3 V;

FIG. 6b is a diagram showing the shift in the peak detection wavelength as a function of applied bias at 80 K. An average voltage tuning of 45 cm$^{-1}$/V was measured;

FIG. 6c is a schematic diagram of the quantum well with the associated energy levels and transitions under zero applied field;

DETAILED DESCRIPTION

Rather than the traditional III-V semiconductor material systems, devices using II-VI semiconductor material system are disclosed herein. For example, ZnCdSe/ZnCdMgSe system grown lattice matched to InP is a potential material for developing intersubband (ISB) devices, such as, for example, QWIPs. Combined with the dual advantage of a large conduction band offset (~1.12 eV) and the absence of intervalley scattering, the ZnCdSe/ZnCdMgSe system is best suited for short-wavelength ISB devices. Furthermore, by adjusting the composition of the materials, the conduction band offset can also be tuned to any value in the range of 0 to 1.12 eV without introducing lattice mismatch, making it especially well-suited for ISB devices responding to a broad range of wavelengths. Compared to III-V materials, the II-VI compounds have a higher electron effective mass. While this reduces the strength of the optical dipole matrix element, it allows designs with thinner barrier layers to prevent tunneling. In effect, II-VI materials can accommodate more active stages than III-V materials for the same total thickness of the structure. Previous studies on this system have already demonstrated ISB absorption in multiple-quantum well (MQW) designs. There have also been recent reports on electroluminescence from ZnCdSe/ZnCdMgSe based Quantum Cascade emitter structures. Despite continued efforts in this direction, there have so far been no reports on QWIPs based on this material system. Disclosed herein is a QWIP based on a ZnCdSe/ZnCdMgSe quantum well structure.

Figure 1A:
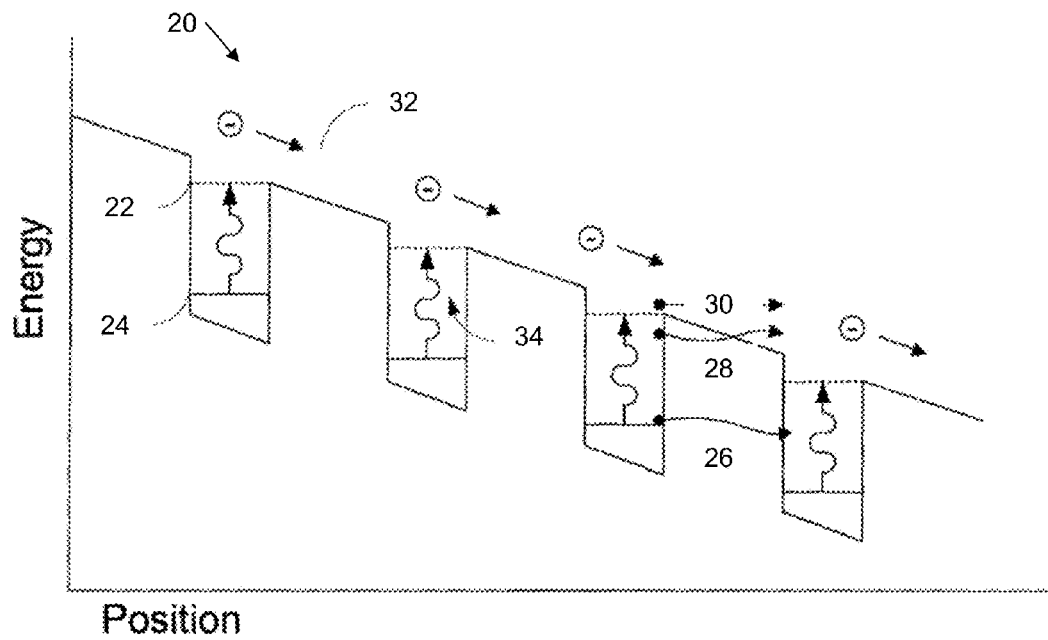
FIG. 1a is a block diagram of a typical quantum well configuration showing movements of electrons from ground state to high energy levels creating photocurrents.

FIG. 1a is a block diagram of a typical quantum well configuration 20 showing movements of electrons from ground state to high energy levels creating photocurrents. Paths of dark currents are also shown. As is well known, a quantum well is generally a nano-scale well with electrons in it. Normally, the electrons are in a state of rest. However, when a photon, a smallest energy packet in a beam of light, disturbs the electrons, the electrons move in the well. The photon may disturb the electrons sufficiently to move the electrons out of the well. Once the electrons are excited out of the well, they produce a current. The current is proportional to the photon intensity hitting the well. By measuring that current, the photodetector can determine how much light comes from various sources at the scene.

When a quantum well is sufficiently deep and narrow, its energy states are quantized. The potential depth and width of the well are adjusted so that it holds only two energy states: a ground state near the well bottom 24, and a first excited state near the well top 22. A photon striking the well excites 34 an electron in the ground state to the first excited state. The electron in this excited state is swept out by an externally-applied voltage to produce a photocurrent 32. Only photons having energies corresponding to the energy separation between the two states are absorbed, resulting in a detector with a sharp absorption spectrum. Performance of the quantum well photodetectors depend on the amount of "dark current" shown generally by reference numbers 26-30. Dark current is generally the current that flows through a biased detector in the dark, i.e., with no photons impinging on it. There are generally a variety of sources for dark current in quantum well photodetectors. These include: sequential tunneling of ground state electrons from well to well 26, thermionic emission of ground state electrons toward the well top followed by tunneling through the barrier tip 28 into the energy continuum above the wells and barriers and thermionic emission of ground state electrons directly out of the well into the energy continuum 30.

QWIP Design and Fabrication

Figure 1B:
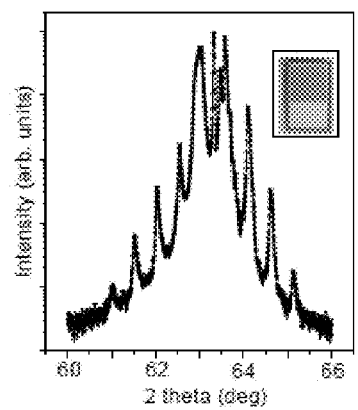
FIG. 1b is a diagram showing X-ray diffraction (XRD) data measured from a QWIP structure prior to processing.

The QWIP was designed based on a bound-to-quasibound transition with a theoretical absorption maximum at 10.0 µm. The quantum well states were computed within a one-band conduction band model approximation with an energy dependent effective mass that accounts for band mixing. The epi-layers consist of 50 periods of 41 Å $Zn_{0.51}Cd_{0.49}Se$ wells doped to $5\times10^{18}$ cm$^{-3}$ separated by 150 Å $Zn_{0.45}Cd_{0.42}Mg_{0.13}Se$ barriers, grown lattice matched to a semi-insulating InP substrate by Molecular Beam Epitaxy (MBE). They were sandwiched between thick, highly doped ZnCdSe (Cl: $5\times10^{18}$ cm$^{-3}$) top and bottom contacts with thickness 4000 Å and 8000 Å, respectively. Prior to the growth of the II-VI epi-layers, a 1500 Å InGaAs layer was deposited to prepare a uniform surface for subsequent II-VI growth. FIG. 1b shows the X-ray diffraction (XRD) data measured from the QWIP structure prior to processing. The clearly differentiated satellite peaks indicate good structural quality of the sample. The thickness of a single period of ZnCdSe/ZnCdMgSe was computed to be 201 Å, corresponding to a 5% deviation from the design period of 191 Å. (Inset) Optical image (top-view) of the QWIP used in the measurements: the device dimensions are 310×485 µm, while the window measures 300×300 µm. The high-resolution X-ray diffraction pattern of the grown wafer was taken using a Bruker D8 Discover XRD. The period of the MQW is calculated using the formula, $$d = \frac{\lambda}{2\cos(\theta)\Delta\theta},$$

where λ is the wavelength of the x-ray (1.54056 Å for Cu $K_\alpha^1$ line), θ is the Bragg angle of the substrate, and Δθ is the angular spacing between adjacent satellite peaks.

The measured thickness of one period of the epi-layer was 201 Å, corresponding to a 5% deviation from the design. The wafer was processed into 310 µm×485 µm rectangular mesas by conventional lithography and wet-chemical etching. Finally, Ti/Au (250 Å/3000 Å) was evaporated for top and bottom contacts. The top contact has a window (300 µm×300 µm) to allow for light absorption in Brewster angle geometry.

QWIP Characterization

Figure 2:
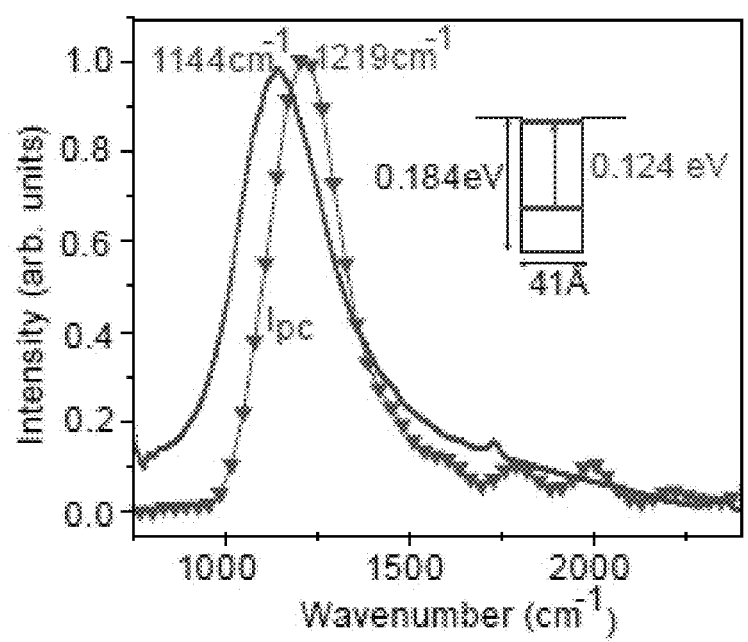
FIG. 2 is a graph showing normalized absorbance of an unbiased wafer at room temperature and photocurrent spectrum of a −2 V biased QWIP at 78 K.

FIG. 2 shows the intersubband absorption and photocurrent spectra as measured using a Fourier Transform Infrared Spectrometer (FTIR). The absorption measurements were carried out in a 45 degree multi-pass transmission geometry at room temperature. The absorption peak at 8.7 µm with a full width at half maximum (FWHM) of 307 cm$^{-1}$ (Δλ/λ=27%) deviates from the designed peak at 10 µm because of the deviation of the structural parameters (well thickness, alloy composition, etc.) from the designed values and a lack of accurate material parameters for some of the II-VI compounds. The photocurrent spectrum was taken at 78K with an applied bias of −2 V in Brewster's angle geometry, with the incident beam chopped at 150 Hz to facilitate detection using lock-in techniques. The peak wavelength in the photocurrent spectrum at 8.2 µm with a FWHM of 237 cm$^{-1}$ (Δλ/λ=20%) is blue-shifted from the absorption peak at 8.7 µm mainly due to the difference in temperature (78K vs. 300K) and applied bias (0V vs. -2V).

The performance of a QWIP is chiefly limited by the dark current.

FIG. 3(a) shows the plot of dark current as a function of temperature from 80 K to 300 K. Dopant segregation in the quantum wells may be the likely origin of the asymmetry in the current-voltage (IV) curves. The dark current increases exponentially with temperature as revealed from a logarithmic plot of current as a function of inverse temperature shown in FIG. 3(b), at different operating voltages. The slope of the plot gives an estimate of the activation energy, which in the case of -3V (triangles), -2V (circles) and -1V (squares) is 72 meV, 80.5 meV and 81 meV, respectively. The dark current noise power spectral density, being proportional to the dark current, degrades the signal to noise ratio and consequently the detectivity as dark current increases. The activation energy (near 0 V), $E_{act}$, defined as the energy difference between the Fermi level and the top of the barrier is given by $I=I_0 \exp(-E_{act}/k_B T)$, where I is the dark current, $I_o$ is a fit parameter and $k_B$ is the Boltzmann constant. Fitting the dark current curves and extrapolating to 0 V gives a value for the activation energy of about 80 meV, in reasonable agreement with the calculated value of 88 meV. In the limit of low applied bias, $E_{act}$ decreases linearly with increasing bias.

Figures 4A, 4B:
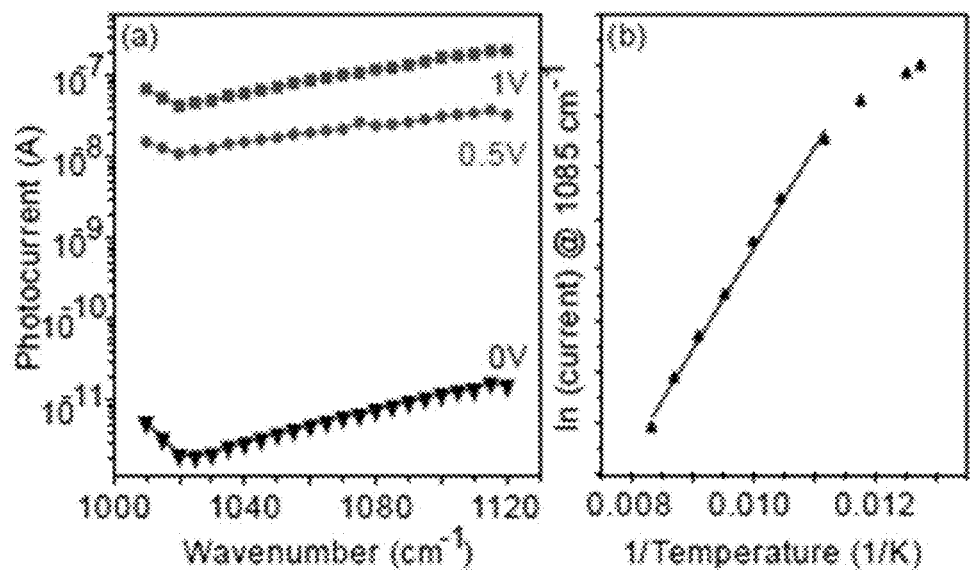
FIG. 4a is a graph showing narrowband photocurrent spectra taken at 78K near the peak absorption wavelength as a function of applied bias.
FIG. 4b is a logarithmic plot of photocurrent at 1085 cm-1 indicating an exponential decay with temperature.
Figures 4C, 4D:
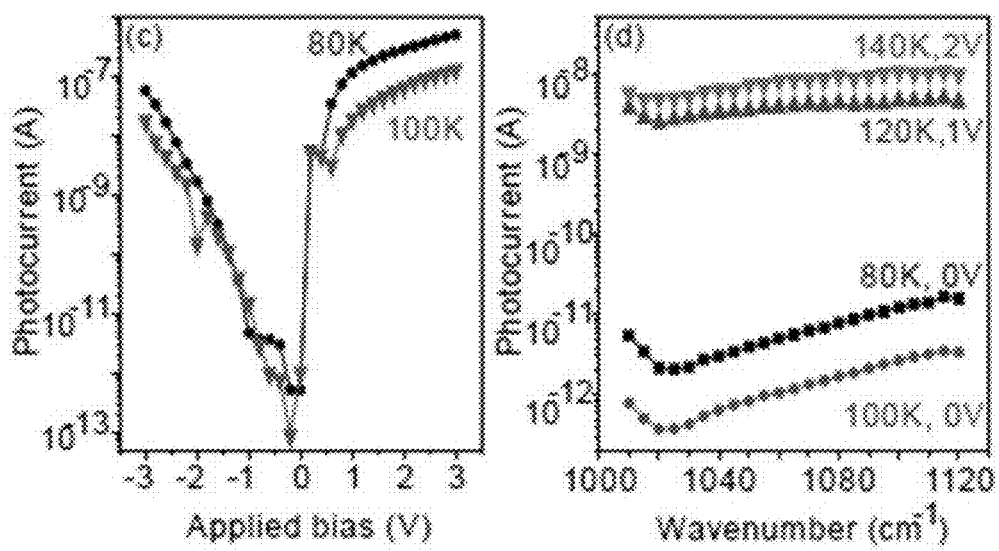
FIG. 4c is a graph showing responsivity measured at 78K and 1085 cm-1 as a function of applied bias.
FIG. 4d is a graph showing photocurrent spectra at temperatures between 80K and 140K, taken by compensating degrading temperature performance with applied bias.

The photocurrent was measured using a Daylight Solutions Inc. continuous wave Quantum Cascade laser tunable between 1000 cm$^{-1}$ and 1120 cm$^{-1}$, slightly off the peak absorption wavenumber of 1144 cm$^{-1}$. Similar to the photocurrent measurement, shifting the spectral measurement to 150 Hz greatly improves the signal-to-noise ratio by eliminating the DC dark current component. FIG. 4a shows the photocurrent data at 78K as a function of applied bias. As can be seen, the photocurrent increases by about 3 orders of magnitude even at a small applied bias of 0.5 V, which follows from the photoconductive nature of the QWIP—any small change away from the flat-band condition would induce a significant increase in the escape probability of an electron from the quantum well and therefore the photocurrent. In addition, the photocurrent also reduces exponentially with temperature, as seen from FIG. 4b, which shows a logarithmic plot of photocurrent taken at 1085 cm$^{-1}$ as a function of inverse temperature. This exponential degradation is due to the exponential increase in dark current with temperature, manifested in the measurement as the difference in voltage across the device between dark and illuminated conditions. Temperatures beyond 120K and voltage below 2V resulted in a photocurrent below the dark-current noise-level of the measurement. However, the photocurrent increases by more than 4 orders of magnitude upon applying a bias, as shown in FIG. 4c taken at 80K and 1085 cm$^{-1}$. Combining these two opposing effects, it is possible to achieve high temperature operation by appropriately compensating degrading temperature performance with an applied bias, as shown in FIG. 4d. With this technique, it was possible to measure photocurrent response up to 140K, despite the large dark current values, see e.g., FIG. 3a. The peak responsivity of the detector at the operating conditions of 80K and 1.5 V applied bias is about 1-10 µA/W, with the low values being chiefly attributed to the large dark current.

Figure 5A:
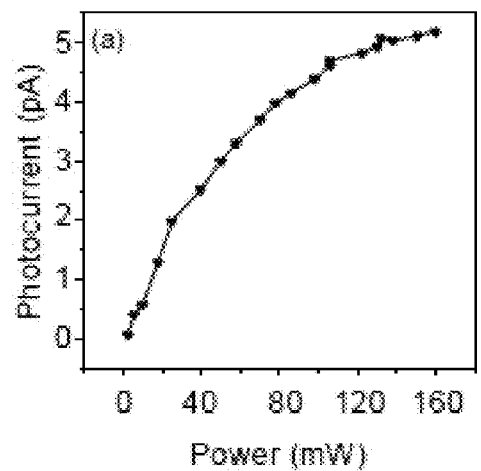
FIG. 5a is a graph showing photocurrent measurements, taken at 1085 cm-1 near the peak absorption wavelength, as a function of laser power, indicating saturation at higher power.
Figure 5B:
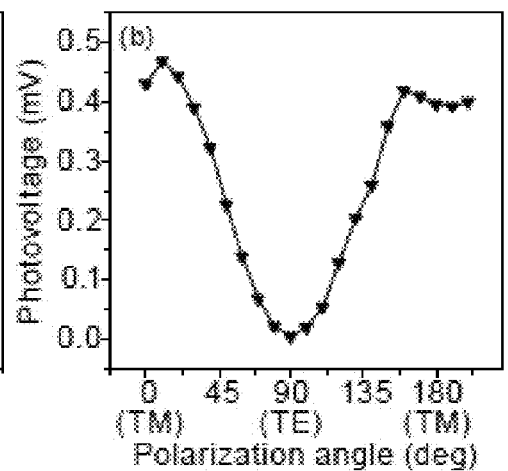
FIG. 5b is a graph showing photocurrent as a function of polarization angle, with a TM/TE rejection ratio of over 100, confirming intersubband absorption over thermal effects.

FIG. 5a shows the response of the detector measured at 1085 cm$^{-1}$ as a function of incident light power at 78K. It is non-linear indicating a saturation of the photocurrent for powers exceeding 160 mW. This is likely due to nonlinear effects in the QWIP at low applied bias, resulting in the formation of multiple electric field domains. We believe that this dynamic range can be improved with a lower doping concentration in the active region. Intersubband excitation has been further confirmed with polarization dependent measurements by rotating the incident laser polarization. FIG. 5b shows the measured photocurrent values at 78K and 1085 cm-1, as a function of polarization angle, showing a TM/TE rejection ratio of over 100. In addition, the device was also tested for photocurrent response far away from the absorption peak using an in-house Quantum Cascade laser at 4 µm. The measured photocurrent was below the noise level of the lock-in amplifier.

The above examples demonstrate the development of a QWIP based on the II-VI ZnCdSe/ZnCdMgSe material system. Intersubband absorption spectra measured using an FTIR showed a broad peak centered around 8.7 µm (FWHM 308 cm$^{-1}$), while the photocurrent spectrum was blue-shifted to 8.2 µm (FWHM: 237 cm$^{-1}$). Photocurrent measurements using a Daylight Solutions Inc. laser indicated an exponential decay of the signal with increasing temperature. Coupled with the more than 4 orders of magnitude change in photocurrent with applied bias, we were able to achieve an operating temperature of 140 K by compensating degrading temperature performance with increasing applied bias.

High Responsivity QWIP

Also disclosed herein is a room temperature, high responsivity, short wavelength II-VI $Zn_{0.51}Cd_{0.49}Se/Zn_{0.29}Cd_{0.26}Mg_{0.45}Se$ based quantum well infrared photodetector (QWIP) operating between 3 and 5 µm. Spectral response was observed up to room temperature with a cut off wavelength of 5 µm at 280 K. Measurements with a calibrated blackbody source yielded a peak responsivity of over 30 A/W at 280 K and an applied bias of -3 V. The dark current limited peak detectivity at 80 K and 280 K were measured to be $2\times10^9$ cm√Hz/W and $4\times10^7$ cm√Hz/W, respectively. These results are consistent with theoretical calculations that predict a maximum detectivity of the order of $10^7$ cm√Hz/W at room temperature for typical carrier lifetimes and optimized doping levels.

The example disclosed above is directed to a long wavelength (10 µm) QWIP from this material system that operated up to 140 K. The performance was limited due to a relatively large dark current and lower gain. In the following example, a short wavelength (3-5 µm) QWIP is disclosed operating at room temperature with a high responsivity of over 30 A/W. This comparatively high value is the result of a large photoconductive gain arising from a low capture probability, and has been independently verified by both direct measurements of responsivity, and gain extracted from noise characteristics.

FIG. 6a is a graph showing the normalized photoresponse of a short wavelength (3-5 µm) QWIP as a function of temperature at an applied bias of 0.3 V. In this example, the QWIP was designed based on a bound-to-quasi bound transition centered at 3.6 µm, within a one-band conduction band model approximation with an energy dependent effective mass that accounts for band mixing. FIG. 6b is a diagram showing the shift in the peak detection wavelength as a function of applied bias at 80 K. An average voltage tuning of 45 cm$^{-1}$/V was measured. FIG. 6c is a schematic diagram of the quantum well with the associated energy levels and transitions under zero applied field.

The active region consisted of 50 periods of 21 Å $Zn_{0.51}Cd_{0.49}Se$ wells doped to $3\times10^{18}$ cm$^{-3}$ separated by 250 Å of undoped $Zn_{0.29}Cd_{0.26}Mg_{0.45}Se$ barriers, sandwiched between two highly doped (Cl: $3 \times 10^{18}$ cm$^{-3}$) $Zn_{0.51}Cd_{0.49}Se$ contact layers, the emitter (top) and the collector (bottom), with thicknesses of 400 nm and 800 nm, respectively. The active region was grown on semi-insulating InP by molecular beam epitaxy (MBE). Prior to the growth of the II-VI epi-layers, a 1500 Å InGaAs layer was deposited to prepare a uniform surface for subsequent II-VI growth. X-ray diffraction measurements (Bruker D8-Discover) yielded a period thickness of 270 Å, in excellent agreement with the designed period of 271 Å. The wafers were processed into 310×485 µm rectangular mesas by standard lithography and wet-etching techniques. Top and bottom contacts of Ti/Au (200 Å/2000 Å) were deposited by e-beam evaporation and a subsequent lift-off process. The top contact has a window of 300×300 µm for light absorption. Processed wafers were mounted on copper heat sinks and wire bonded.

FIG. 6a shows the normalized photoresponse of the detector as a function of temperature at an applied bias of 0.3 V. The photocurrent spectrum was measured with the device at 45° to the incident beam, chopped at 150 Hz, and detected through an amplifier using standard lock-in techniques. It has been experimentally verified that the characteristics of the measured device does not depend on the frequency of the chopper. The peak detection wavelength at 80 K was 4 µm, shifted from the designed wavelength of 3.6 µm. This apparently large shift can arise from a variation in quantum well thickness as small as 1 to 2 Å. In addition, the full width at half maximum (FWHM) of the photoresponse was measured to be 489 cm$^{-1}$ ($\Delta\lambda/\lambda_{peak}$=19%) and 521 cm$^{-1}$ ($\Delta\lambda/\lambda_{peak}$=22%) at 80 and 280 K respectively. These values of FWHM (19% at 80 K) are slightly higher than conventional spectral widths for quasi-bound transitions (~15%), indicative of the upper state being squeezed out of the quantum well, into the extended states above the barrier. Such a design also lends itself to spectral tuning with applied bias, as seen in FIG. 6b, which shows the peak detection wavenumber as a function of applied bias taken at 80 K. An average tuning of 45 cm$^{-1}$/V was obtained.

Figure 7A:
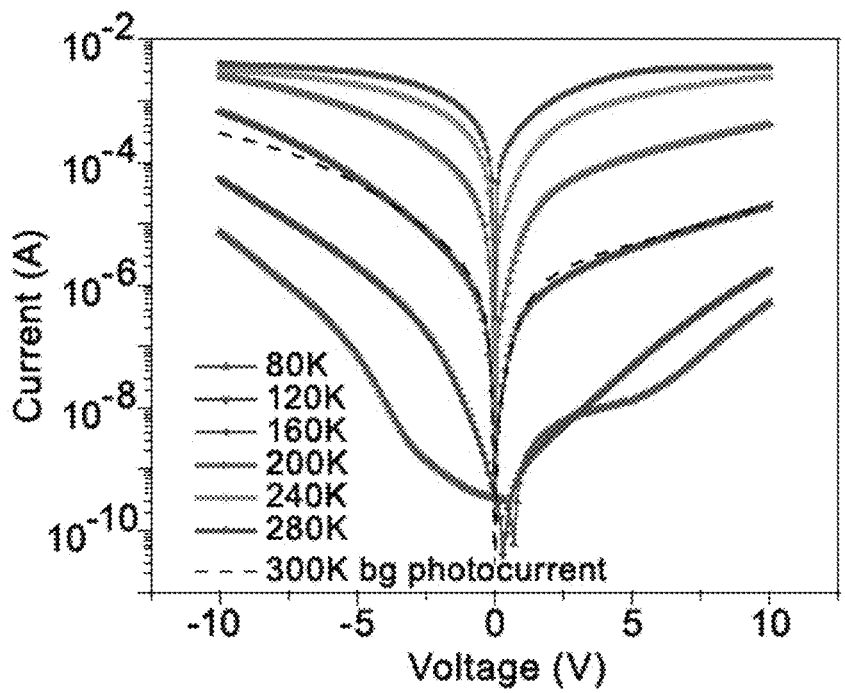
FIG. 7a is a graph showing dark current-voltage (I-V) characteristics of the QWIP as a function of temperature.
Figure 7B:
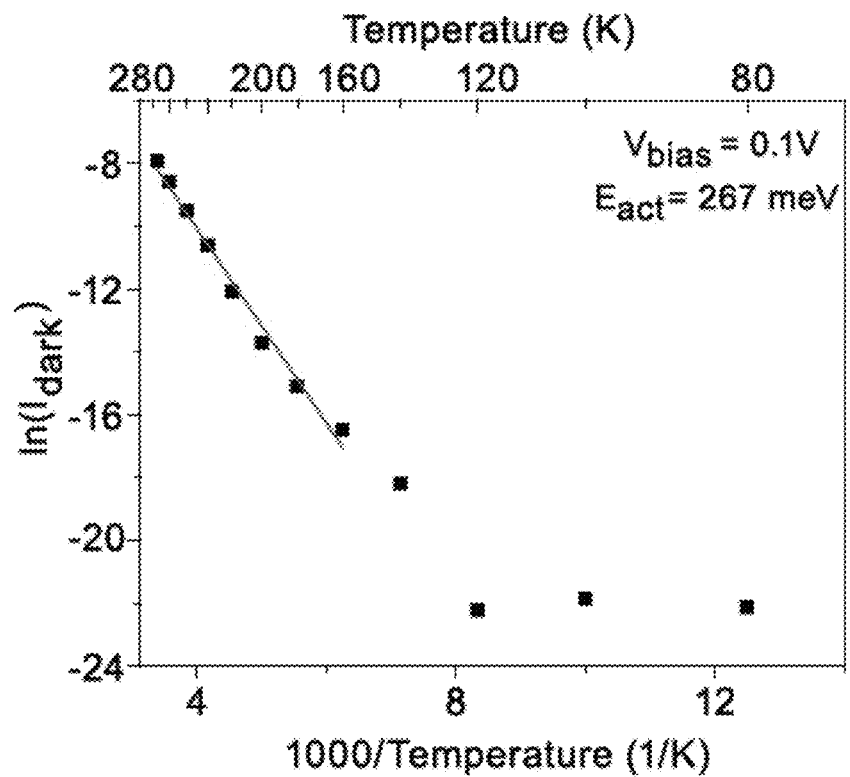
FIG. 7b is a logarithmic plot of dark current as a function of inverse temperature at 0.1V applied bias yields an activation energy of 267 meV, in close agreement with the peak in the photocurrent spectrum.

The detectivity (D*) of a QWIP is chiefly limited by the dark current noise. FIG. 7a plots the dark current-voltage (I-V) characteristics of the QWIP at different heat-sink temperatures. The dotted curve corresponds to the 300 K background photocurrent measured at 80 K, thereby yielding a background limited infrared performance (BLIP) temperature of 160 K. The asymmetry seen in the I-V curves at lower temperatures is a result of dopant migration in the quantum wells. This phenomenon has been well documented in the literature and also seen in QWIPs made earlier from this material system. An Arrhenius plot of the dark current as a function of temperature, as shown in FIG. 7b, yields an activation energy of 267 meV. This value of the activation energy is consistent with the measured photocurrent spectrum and validates the thermal origin of dark currents at higher temperatures. A constant dark current at lower temperatures is indicative of the tunneling regime in the limit of low applied bias.

Figure 8:
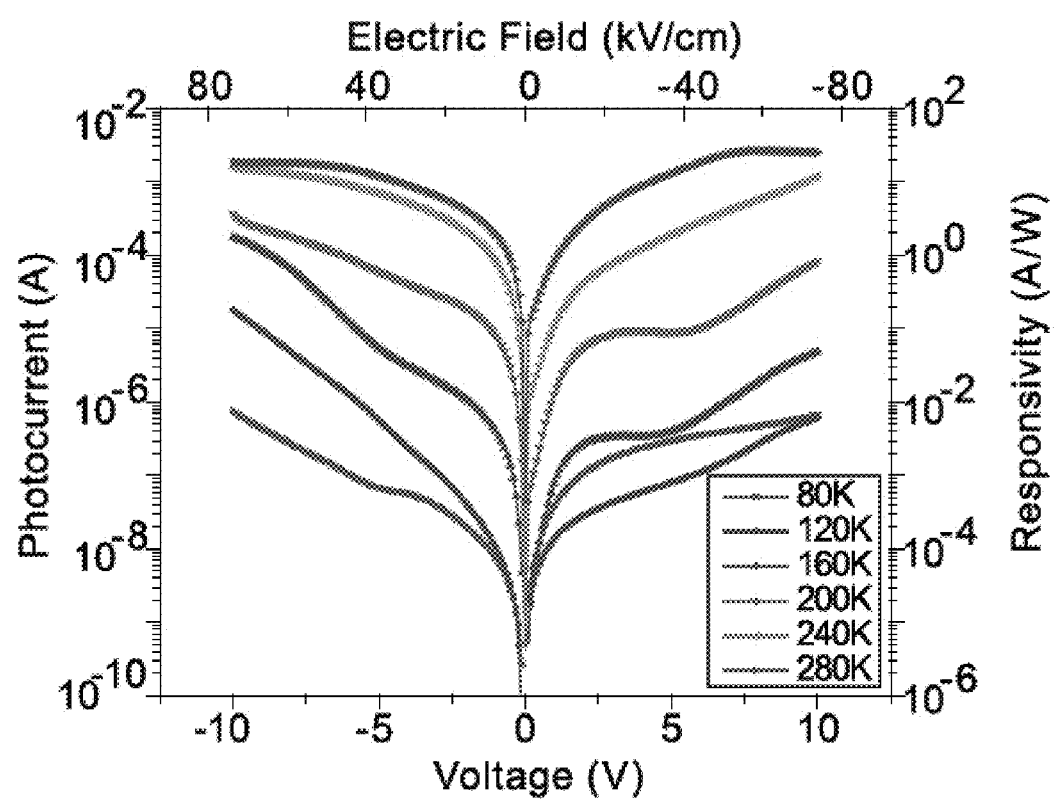
FIG. 8 is a graph showing the measured responsivities as a function of applied bias from 80 K to 280 K.

Responsivity measurements were carried out using a calibrated black body source at 900 K and the device was placed in a variable temperature cryostat in 300 K background. FIG. 8 shows the measured responsivities as a function of applied bias from 80 K to 280 K. The calculations estimate a 10% collection efficiency, taking into account the device area and the spot-size of the incident radiation. A high peak responsivity of over 30 A/W was obtained at 280 K, compared to other QWIPs operating between 3 and 5 µm. This corresponds to a very high quantum efficiency-gain product of over 10. The responsivity exponentially increases for low bias due to the strong increase in gain and escape probability. At high bias, the responsivity saturates in spite of a low capture probability due to saturation in gain arising from the saturation of carrier drift velocity[26]. In addition, responsivity increases with temperature due to an increase in photoconductive gain.

Figure 9A:
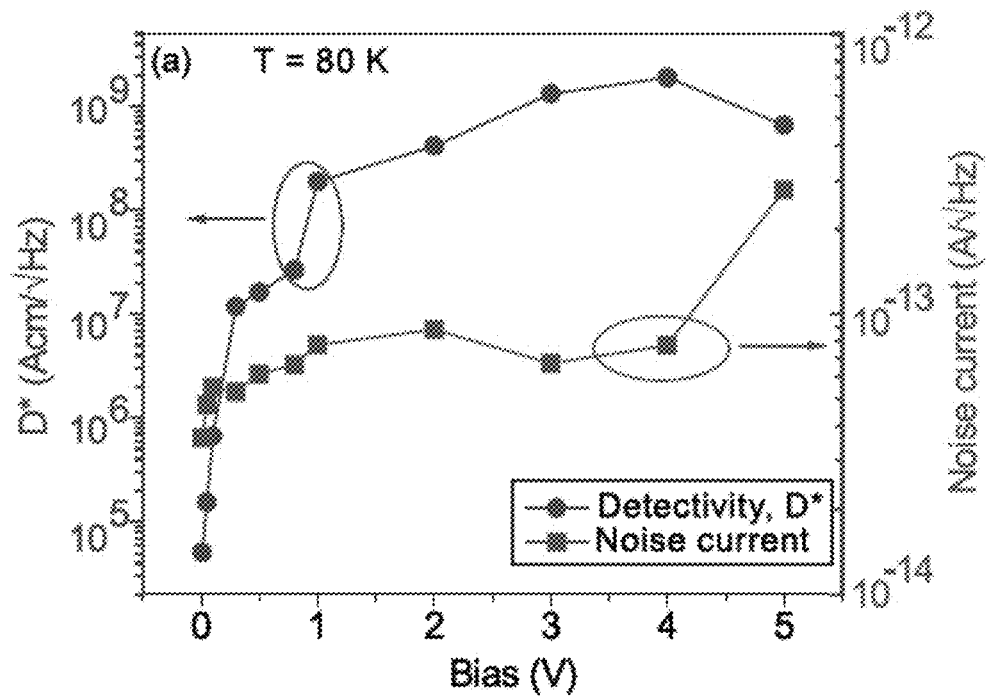
FIG. 9a is a graph showing noise current (squares) and detectivity (circles) as a function of applied bias at 80K.
Figure 9B:
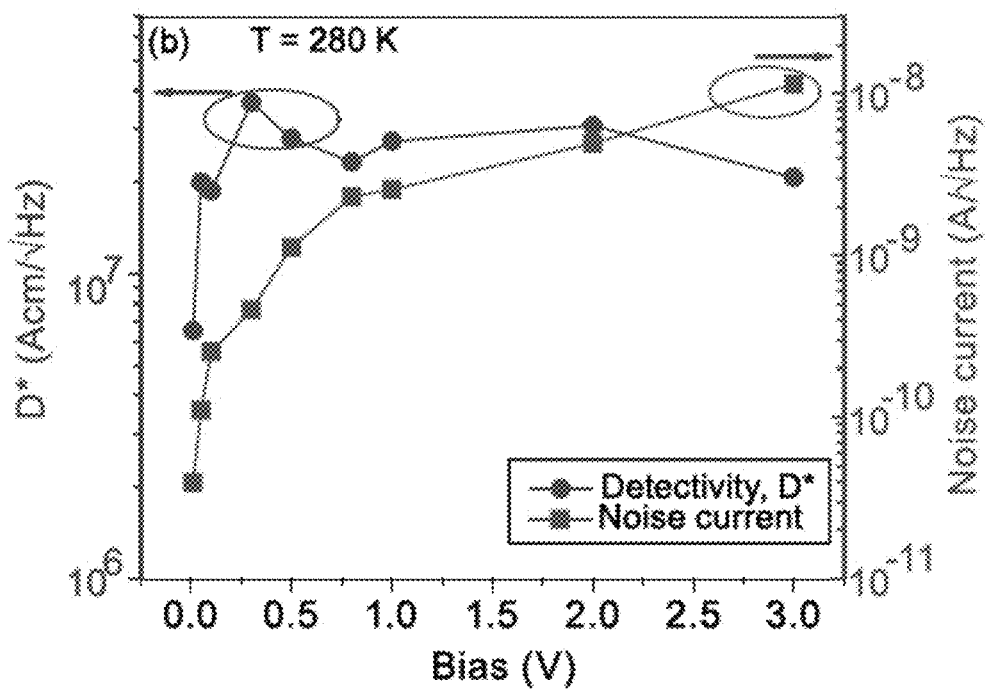
FIG. 9b is a graph showing noise current (squares) and detectivity (circles) as a function of applied bias at 280 K.

The dark current noise of the detector was measured using a spectrum analyzer and a low noise current preamplifier, with the device mounted inside a cryo-shield to prevent shot noise generation from background radiation. FIG. 9a shows the noise current and dark current limited detectivity measured at 80 K, at a frequency of 730 Hz. It is important to note that at low bias, the dark current noise at 80 K, about $10^{-13}$ A/√Hz, approaches the limited of Johnson noise in the device, $10^{-14}$ A/√Hz. In addition, a peak detectivity of $2\times10^9$ cm√Hz/W was obtained at an applied bias of 3 V. This number is reduced to about $4\times10^7$ cm√Hz/W at 280 K, as seen from FIG. 9b, which shows the noise current and detectivity data at 280 K.

As expected, this reduction in D* is a result of the increase in the noise current with temperature. However, D* does not decrease as rapidly (about 2 orders of magnitude reduction from 80 K to 280 K) because of a correspondingly significant increase in responsivity in the same temperature range. This increase can be attributed to increased photoconductive gain at higher temperatures. It has been previously demonstrated[25] that the noise gain is equal to the photoconductive gain in QWIPs in the limit of unity carrier escape probability, which would be satisfied at room temperature and high applied bias. Estimates of this photoconductive gain made from dark current noise measurements at 280 K resulted in value greater than 1000 cm$^{-1}$ for applied bias greater than 0.3 V. Concurrently, the capture probability of the electron above the barrier was found to be very close to zero.

Figure 10A:
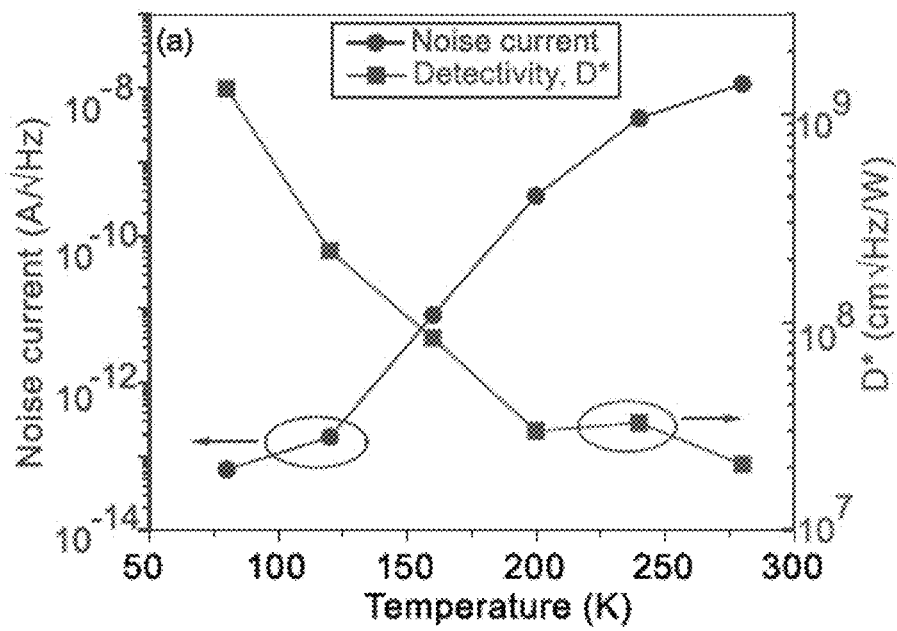
FIG. 10a is a graph showing noise current (circles) and detectivity (squares) of a 3V biased device as a function of temperature.
Figure 10B:
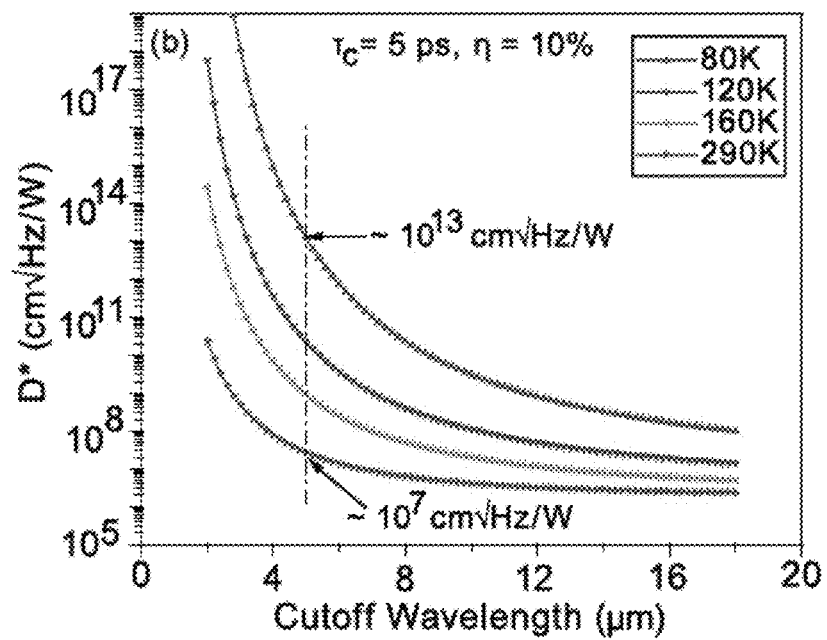
FIG. 10b is a graph showing theoretical estimates of maximum peak detectivity as a function of the cut-off wavelength of the detector at different temperatures.

FIG. 10a gives the temperature performance of the detector in terms of its noise current and detectivity at an applied bias of 3 V. The detectivity drops from a peak of $2\times10^9$ cm√Hz/W at 80 K to $4\times10^7$ cm√Hz/W at 300 K. At the BLIP temperature of 160 K, the noise current and detectivity are $10^{-11}$ A/√Hz and $10^8$ cm√Hz/W respectively. FIG. 10b plots the theoretical estimate of peak D* for optimized doping levels[26] at each temperature as a function of the detector cut off wavelength.

The D* has been calculated using the relation[26], $$D^* = \frac{\lambda}{2hc} \frac{\eta}{\sqrt{N}} \sqrt{\frac{\tau_c}{N_{3D}L_p}},$$

where $\lambda$ is the wavelength, h is the Planck's constant, c is the speed of light, $\eta$ is the total absorption efficiency, N is the number of periods, $\tau_c$ is the carrier lifetime, $N_{3D}$ is the above barrier electron density and $L_p$ is the length of one period of the active region. It is important to note that this theoretical D* involves assumptions about the above barrier electron density, absorption efficiency and carrier lifetimes, and therefore only an order of magnitude comparison would be valid. Assuming a total absorption efficiency of 10%, a carrier lifetime of 5 ps and estimating the above barrier electron density from a 3D carrier drift model[26] using the expression, $$N_{3D} = 2\left(\frac{2\pi m_b k_B T}{h^2}\right)^{3/2} \exp\left(\frac{-hc}{\lambda_c k_B T} + \frac{E_F}{k_B T}\right)$$

where $m_b$ is the electron effective mass in the barrier, $k_B$ is the Boltzmann constant, T is the temperature, $\lambda_c$ is the cut-off wavelength, and $E_F$ is the 2-D Fermi level in the quantum well, the maximum D* at 290 K is found to be about $10^7$ cm√Hz/W, in reasonable agreement with the value obtained from our device $4\times10^7$ cm√Hz/W at 280 K. However, the measured D* at 80 K is significantly lower than the theoretical estimate of about $10^{13}$ cm/√Hz/W. This is likely due to the overestimation of absorption efficiency and a non-optimized doping level.

Figure 11A:
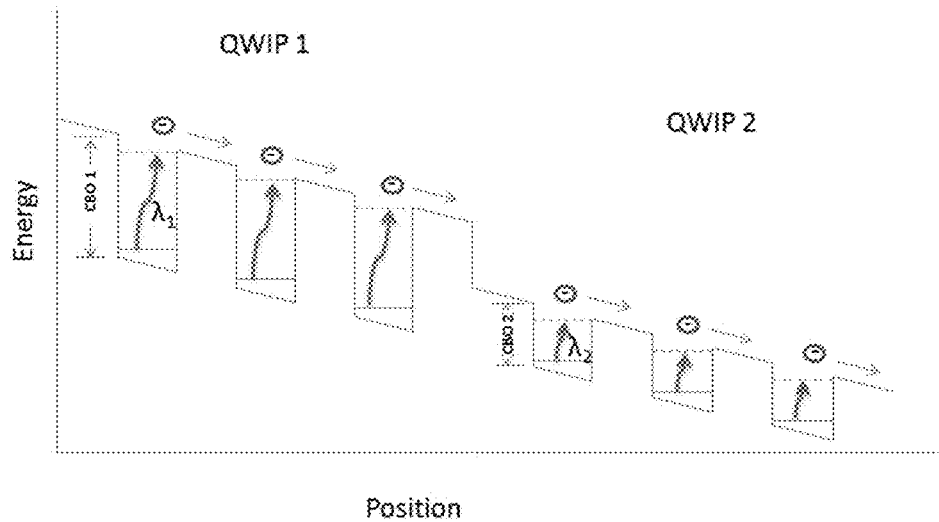
FIG. 11a is a block diagram of a typical quantum well configuration for two stacked QWIPs each responding to a different wavelength (λ1 and λ2)
Figure 11B:
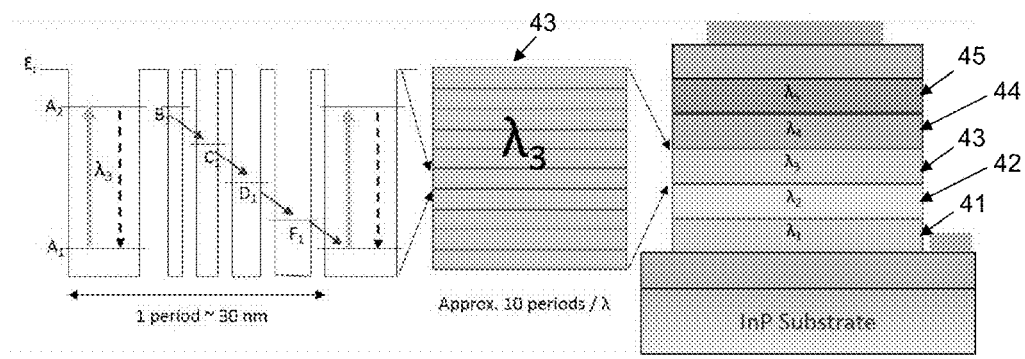
FIG. 11b is a block diagram of a broadband QWIP with a larger stacked structure.

FIGS. 11a and 11b are block diagrams of a broadband QWIP with a stacked structure. As explained above, by adjusting the composition of the materials, the conduction band offset can also be tuned to any value in the range of 0 to 1.12 eV without introducing lattice mismatch, making it especially well-suited for ISB devices responding to a broad range of wavelengths. Compared to III-V materials, the II-VI compounds have a higher electron effective mass. While this reduces the strength of the optical dipole matrix element, it allows designs with thinner barrier layers to prevent tunneling. In effect, II-VI materials can accommodate more active stages than III-V materials for the same total thickness of the structure.

FIG. 11a is a block diagram of a typical quantum well configuration for two stacked QWIPs each responding to a different wavelength ($\lambda1$ and $\lambda2$). FIG. 11a also shows two different values of the conduction band offsets (CBOs) used for this structure. Many of these QWIPs can be stacked, each responding to a different wavelength to form as broadband detector.

FIG. 11b shows a larger stacked structure with several stacked QWIPs shown as generally by reference numbers 41-45. Each QWIP responds to a different wavelength ($\lambda1$-$\lambda5$) and the entire device can therefore detect in a broad range. It should be understood that the number of stacks may be varied without departing from the scope of this disclosure. The conduction band offset may be adjusted as discussed generally above. For example, the long wave detector has a conduction band offset of 0.184 eV while the short wave detector has an offset of 0.56 eV. Both these devices are lattice matched or grown strain-free on InP substrate. Therefore, it is possible to put these multiple detectors together to generate a single device that can detect at multiple wavelengths. Using the techniques disclosed herein the conduction band offset may be tuned to any value in the range of 0 to 1.12 eV without introducing lattice mismatch and a broadband QWIP with a stacked structure may be constructed e.g., with each stack having a different a conduction band offset.

In conclusion, disclosed herein are short wavelength II-VI $Zn_{0.51}Cd_{0.49}Se/Zn_{0.29}Cd_{0.26}Mg_{0.45}Se$ based QWIP operating between 3 and 5 µm. Room temperature photoresponse was observed, with a peak responsivity of over 30 A/W at 280 K. Dark current limited detectivity of $2\times10^9$ cm√Hz/W and $4\times10^7$ cm√Hz/W were measured at 80 K and 280 K respectively. These results closely agree with theoretical calculations that predict a maximum D* of $10^7$ cm/√Hz/W at 290 K.

The references listed herein are also part of the application and are incorporated by reference in their entirety as if fully set forth herein including: Ravikumar et al. "Room Temperature and High Responsivity Short Wavelength II-VI Quantum Well Infrared Photodetector" Conference on Lasers and Electro Optics (CLEO) San Jose, Calif., 2013; Ravikumar et al. "Room temperature and high responsivity short wavelength II-VI quantum well infrared photodetector" Appl. Phys. Lett. 102, 161107 (2013); Shen et al. "MBE growth of ZnCdSe/ZnCdMgSe quantum-well infrared photodetectors" J. Vac. Sci. Technol. B 31(3), May/June 2013, 03C113-1-03C113-3. It should be understood that many variations are possible based on the disclosure herein. Although features and elements are described above in particular combinations, each feature or element can be used alone without the other features and elements or in various combinations with or without other features and elements.

What is claimed is:

1. A quantum well infrared photodetector (QWIP) comprising:
   a plurality of epi-layers formed into multiple periods of quantum wells, each of the quantum wells being separated by a barrier,
   an emitter contact layer formed above the quantum wells, and
   a collector contact layer formed below the quantum wells,
   the quantum wells, barriers, emitter contact layer, and collector contact layer being formed of II-VI semiconductor materials comprising zinc, cadmium, and selenium.

2. A multiple wavelength QWIP comprising a plurality of QWIPs of claim 1 stacked onto a single epitaxial structure, in which the different QWIPs are designed to respond at different wavelengths.

3. A dual wavelength QWIP comprising two QWIPs of claim 1 stacked onto a single epitaxial structure, in which one QWIP is designed to respond at 10 µm and the other at 3-5 µm wavelengths.

4. The QWIP of claim 1 wherein the II-VI semiconductor materials further comprise magnesium.

5. The QWIP of claim 1 comprising an active region grown on an InP substrate wherein the II-VI semiconductor materials comprise compositions that produce layers that are lattice-matched to the InP substrate.

6. The QWIP of claim 1 wherein the quantum wells comprise $Zn_{0.51}Cd_{0.49}Se$.

7. The QWIP of claim 1 wherein the barriers comprise $Zn_{0.45}Cd_{0.42}Mg_{0.13}Se$.

8. The QWIP of claim 1 wherein the barriers comprise $Zn_{0.29}Cd_{0.26}Mg_{0.45}Se$.

9. The QWIP of claim 1 comprising an active region grown on an InP substrate.

10. The QWIP of claim 1 comprising an active region grown on InP substrate with a lattice-matched InGaAs buffer layer.

11. A method of making quantum well infrared photodetector (QWIP), the method comprising:
   forming a plurality of epi-layers formed into multiple periods of quantum wells;
   forming at least one barrier between the quantum wells;
   forming an emitter contact layer above the quantum wells; and
   forming a collector contact layer below the quantum wells, the quantum wells, barrier, emitter contact layer, and collector contact layer being formed of II-VI semiconductor materials comprising zinc, cadmium, and selenium.

12. The method of claim 11 further comprising forming a plurality of the QWIPs of claim 11 stacked onto a single epitaxial structure, in which the different QWIPs are designed to respond at different wavelengths.

13. The method of claim 11 further comprising forming dual wavelength QWIP comprised of two QWIPs of claim 11 stacked onto a single epitaxial structure, in which one QWIP is designed to respond at 10 µm and the other at 3-5 µm wavelengths.

14. The method of claim 11 wherein the II-VI semiconductor materials further comprise magnesium.

15. The method of claim 11 further comprising forming an active region grown on an InP substrate wherein the II-VI semiconductor materials comprise compositions that produce layers that are lattice-matched to the InP substrate.

16. The method of claim 11 wherein the quantum wells comprise $Zn_{0.51}Cd_{0.49}Se$.

17. The method of claim 11 wherein the barriers comprise $Zn_{0.45}Cd_{0.42}Mg_{0.13}Se$.

18. The method of claim 11 wherein the barriers comprise $Zn_{0.29}Cd_{0.26}Mg_{0.45}Se$.

19. The method of claim 11 further comprising forming an active region grown on an InP substrate.

20. The method of claim 11 further comprising forming an active region grown on InP substrate with a lattice-matched InGaAs buffer layer.

21. A quantum well infrared photodetector (QWIP) comprising:
  a plurality of epi-layers formed into multiple periods of quantum wells, each of the quantum wells being separated by a barrier,
  an emitter contact layer formed below the quantum wells, and
  a collector contact layer formed above the quantum wells,
  the quantum wells, barriers, emitter contact layer, and collector contact layer being formed of II-VI semiconductor materials comprising zinc, cadmium, and selenium.

* * * * *